(12) United States Patent
Dapkus et al.

(10) Patent No.: US 6,348,159 B1
(45) Date of Patent: Feb. 19, 2002

(54) METHOD AND APPARATUS FOR ETCHING COATED SUBSTRATES

(75) Inventors: Todd J. Dapkus, Toledo; John R. Bohland, Oregon, both of OH (US)

(73) Assignee: First Solar, LLC, Perrysburg, OH (US)

( * ) Notice: Subject to any disclaimer, the term of this patent is extended or adjusted under 35 U.S.C. 154(b) by 0 days.

(21) Appl. No.: 09/250,654

(22) Filed: Feb. 15, 1999

(51) Int. Cl.⁷ .............................................. H01L 21/00
(52) U.S. Cl. ........................... 216/83; 216/96; 216/100; 134/36; 134/95.3; 134/108
(58) Field of Search .............................. 134/34–36, 58, 134/66, 108, 93, 95.3, 103.2; 156/345; 216/83, 100, 105, 96–97; 438/745

(56) References Cited

U.S. PATENT DOCUMENTS

| | | | |
|---|---|---|---|
| 3,871,914 A | 3/1975 | Goffredo et al. | 134/109 |
| 4,060,477 A | 11/1977 | Nelson | 204/650 |
| 4,097,710 A | 6/1978 | Maillet | 219/69.14 |
| 4,501,636 A | 2/1985 | Valley | 156/345 |
| 4,540,465 A * | 9/1985 | Coggins et al. | 216/93 |
| 4,555,302 A * | 11/1985 | Urbanik | 156/637 |
| 4,595,451 A | 6/1986 | Holzer | 216/13 |
| 4,624,729 A | 11/1986 | Bresciani et al. | 156/345 |
| 4,772,357 A | 9/1988 | Carlson et al. | 216/84 |
| 5,344,542 A | 9/1994 | Maher et al. | 204/298.14 |
| 5,672,239 A | 9/1997 | DeOrnellas | 438/706 |

OTHER PUBLICATIONS

Robert E. Goozner, William F. Drinkard, Mark O. Long and Christi M. Byrd—A Process To Recycle Thin Film PV Materials—26th PVSC; Sep. 30–Oct. 3, 1997, Anaheim, CA—pp. 1161–1163—1997 IEEE.

John Bohland, Igor Anisimov and Todd Dapkus—Economic Recycline of cdTe Photovoltaic Modules—26th PVSC; Sep. 30–Oct. 3, 1997; Anaheim, CA—pp. 355–358—1997 IEEE.

* cited by examiner

*Primary Examiner*—Felisa Hiteshew
*Assistant Examiner*—Duy-Vu Deo
(74) *Attorney, Agent, or Firm*—Brooks & Kushman P.C.

(57) ABSTRACT

A method for etching substrates, comprising providing at least a first and a second substrate having a coating selected from the group consisting of semiconductor coatings, metallic coatings, and mixtures thereof and introducing at least the first substrate and an etchant into a first tank to etch at least a portion of the coating from the first substrate, introducing at least the second substrate into a second tank and transferring the etchant from the first tank to the second tank to provide etch of at least a portion of the coatings from the second substrate, and removing the etched first substrate from the first tank.

30 Claims, 7 Drawing Sheets

METHOD AND APPARATUS FOR ETCHING COATED SUBSTRATES

TECHNICAL FIELD

This invention relates to a method and apparatus for etching substrates having a coating selected from the group consisting of semiconductor coatings, metallic coatings, and mixtures thereof.

BACKGROUND ART

There are numerous articles which contain a relatively expensive base substrate which receive, or serve as the foundation for, subsequent coatings selected from the group consisting of semiconductor coatings, metallic coatings, and mixtures thereof. These articles are typically produced by successively building up coatings, layers of materials, and/or substrates on the base substrate, and/or materials which are subsequently built up from base substrate. The manufacture of these articles is made more costly by the relative frequent occurrence of defective deposition of conductive coatings.

One example of such an article is a cadmium telluride photovoltaic (CdTe PV) solar cell module. CdTe PV solar cell modules are typically made by providing a base substrate comprising a first glass layer having a coating of tin oxide ($SnO_2$) deposited thereon, depositing a coating of semiconductor cadmium sulfide (CdS) over the tin oxide coating, then depositing a coating of semiconductor cadmium telluride (CdTe) over the cadmium sulfide coating, then adhering a metal contact layer onto the cadmium telluride coating, then adhering a layer of polymeric material, such as ethylene-vinyl acetate (EVA), onto the metal contact layer, followed by adhering a second glass layer onto the polymeric layer.

Each coating or layer is built up onto the underlying coating or layer in successive steps. After each coating is deposited, the coating is analyzed to ensure that the coating has been properly deposited. Any solar cell module formed with defective coatings would itself be defective. Processing errors in the deposition of the cadmium sulfide coating or the cadmium telluride coating occur with relative frequency, such as on the order of about 10% of the time. Examples of processing errors include, but are not limited to, improper coating thickness and insufficient coating uniformity.

As a practical matter, substrates which have been improperly coated are often discarded, rather than recycled, because there has not been an inexpensive, convenient, and easy method for removing the improperly deposited coatings while leaving the substrate intact. It would be desirable to provide an inexpensive method for removing improperly deposited conductive coatings without damaging the base substrate intact.

DISCLOSURE OF INVENTION

One object of the present invention is to provide an inexpensive method for removing coatings from substrates having a coating selected from the group consisting of semiconductor coatings, metallic coatings, and mixtures thereof while keeping the substrate intact.

Another object of the present invention is to provide an apparatus having a small footprint which is capable of removing coatings from substrates having a coating selected from the group consisting of semiconductor coatings, metallic coatings, and mixtures thereof while keeping the substrate intact.

Yet another object of the present invention is to provide an inexpensive method for removing defective cadmium coatings from cadmium telluride photovoltaic solar cell module subassemblies while leaving the glass substrate intact with the tin oxide coating adhered thereto.

Still yet another object of the present invention is to provide an apparatus having a relatively small footprint which is capable of removing defective cadmium coatings from cadmium telluride photovoltaic solar cell module subassemblies while leaving the glass substrate intact with the tin oxide coating adhered thereto.

In carrying out the above, and other, objects, the present invention provides a method for etching substrates having a coating selected from the group consisting of semiconductor coatings, metallic coatings, and mixtures thereof. The method comprises providing at least a first and a second substrate having a coating selected from the group consisting of semiconductor coatings, metallic coatings, and mixtures thereof and introducing at least the first substrate and an etchant into a first tank to etch at least a portion of the coating from the substrate. At least the second substrate is introduced into a second tank and the etchant is transferred from the first tank to the second tank to etch at least a portion of the coating from the second substrate. The etched first substrate is then removed from the first tank.

The present invention also provides an apparatus for etching substrates having a coating selected from the group consisting of semiconductor coatings, metallic coatings, and mixtures thereof. The apparatus comprises a first tank for receiving a substrate having a coating selected from the group consisting of semiconductor coatings, metallic coatings and mixtures thereof. The apparatus also includes a second tank for receiving an etchant, and a pump for pumping the etchant from the second tank to the first tank to etch at least a portion of the coating from the substrate and for thereafter pumping the etchant back to the first tank.

The present invention further provides a method for etching a substrate having a coating selected from the group consisting of semiconductor coatings, metallic coatings, and mixtures thereof. The method comprises introducing the substrate into a first tank. An etchant capable of etching the coating from the substrate is introduced into a second tank. The etchant is transferred from the second tank to the first tank to provide etching of at least a portion of the coating from the substrate within the first tank. The etchant is transferred from the first tank back to the second tank, and the etched substrate is then removed from the first tank.

The objects, features and advantages of the present invention are readily apparent from the following detailed description of the best mode for carrying out the invention when taken in connection with the accompanying drawings.

BEST MODE FOR CARRYING OUT THE INVENTION

The present invention relates to a method for etching, i.e., removing, coatings from at least one substrate having a coating selected from the group consisting of semiconductor coatings, metallic coatings, and mixtures thereof, while keeping the substrate intact. The method may vary in dependence upon the article, and in particular, upon the materials which comprise the article. The present invention also relates to an apparatus for performing the method of the present invention. The method and the apparatus of the present invention will be described hereinafter in an integrated manner to help facilitate an understanding of the different aspects of the present invention.

Examples of materials which the substrate may be made of include, but are not limited to, glass, wood and plastic. Coatings for which the present invention is useable with are etchable metallic coatings, semiconductor coatings, and mixtures thereof. Examples of etchable coatings for which the present invention is useable with include coatings made of, but not limited to, barium, cadmium, lead, mercury, selenium, silver, tellurium, and gold. Examples of substrates coated with at least one coating selected from the group consisting of semiconductor coatings, metallic coatings, and mixtures thereof include, but are not limited to, copper indium diselinide photovoltaic solar cell modules, glass mirrors, and plasma flat panel displays.

The present invention is particularly well suited for removing off-specification semiconductor cadmium coatings from cadmium telluride photovoltaic solar cell module subassemblies, and as such, will be described herein in connection with them, but in doing so is not intended to limit its applicability to just cadmium telluride photovoltaic solar cell module subassemblies.

Figure 1:
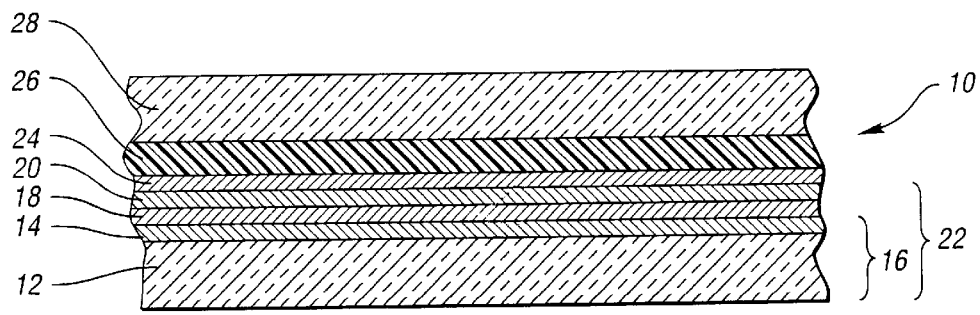
FIG. 1 is a sectional view of a cadmium telluride photovoltaic solar cell module.

Referring to FIG. 1, an exemplary cadmium telluride photovoltaic solar cell module 10 is shown. The module 10 comprises a first glass substrate 12. The glass substrate 12 has a coating of tin oxide ($SnO_2$) 14, which is preferably doped with fluorine ($SnO_2$:F), adhered thereto and overlying the glass substrate 12. Preferably, the glass substrate 12 and the tin oxide coating 14 can be provided as a unitary, preformed base substrate 16 from a suitable supplier. A semiconductor cadmium sulfide (CdS) coating 18 is adhered to and overlies the tin oxide coating 14. The cadmium sulfide coating 18 is preferably deposited over the tin oxide layer 14 in any suitable manner known in the art. A semiconductor cadmium telluride (CdTe) coating 20 is adhered to and overlies the cadmium sulfide coating 18. The cadmium telluride coating 20 is preferably deposited on the cadmium sulfide coating 18 in any suitable manner known in the art. The glass substrate 12, the tin oxide coating 14, the cadmium sulfide coating 18 and the cadmium telluride coating 20 together form a cadmium telluride photovoltaic solar cell module subassembly 22.

A metal contact layer 24 is adhered to and overlies the subassembly 22, i.e, the cadmium telluride coating 20. A layer of polymeric material 26, preferably ethylene-vinyl acetate (EVA), is adhered to and overlies the metal contact layer 24. A second glass substrate 28 is adhered to and overlies the layer of polymeric material 26.

Figure 2:
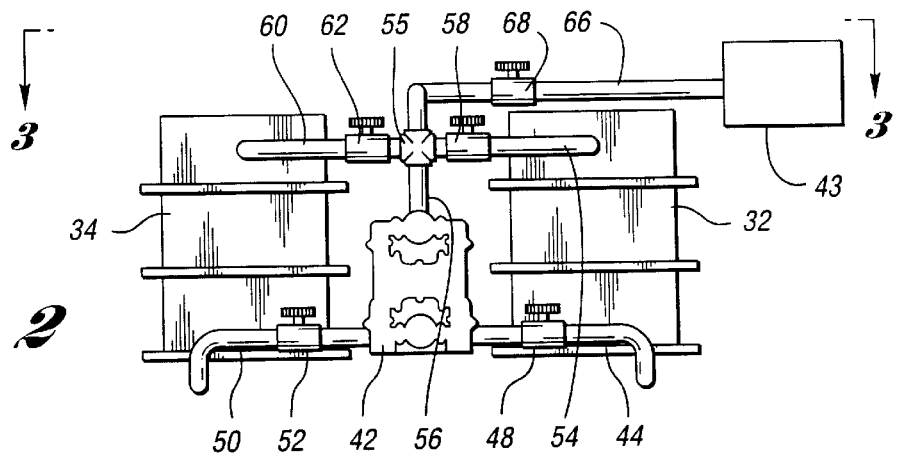
FIG. 2 is an elevational view of an apparatus for use with the method of the present invention.
Figure 3:
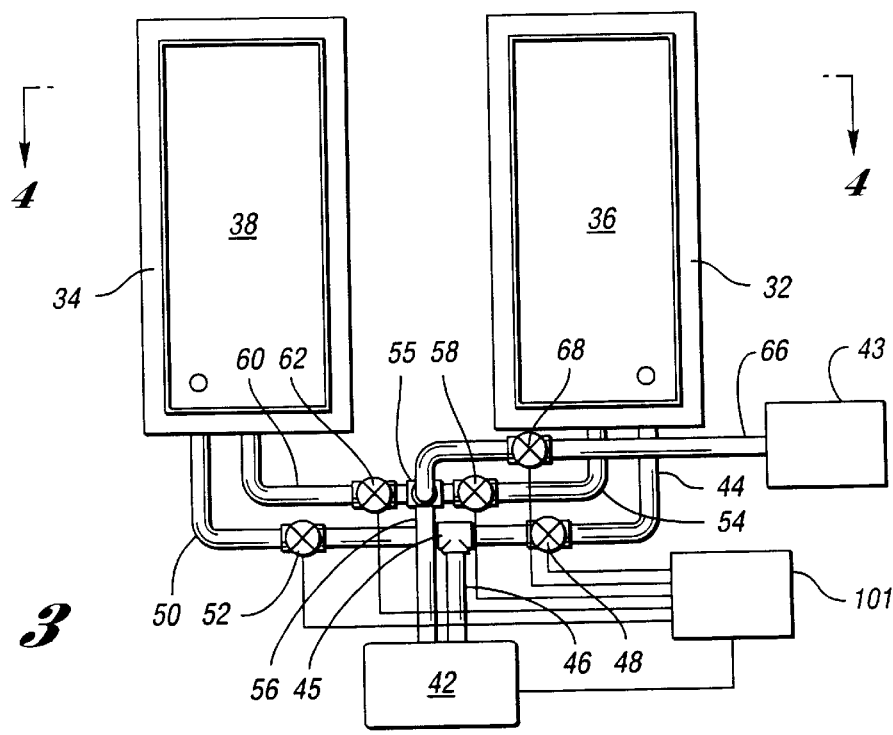
FIG. 3 is a view taken along line 3—3 of FIG. 2.

The method of the present invention is useful, when it is desirable to remove the cadmium sulfide coating 18, the cadmium telluride coating 20, or both, when off-specification coatings have been deposited on the base substrate 16. Referring to FIGS. 2 and 3, an etching apparatus 30, which is useable with the method of the present invention, is shown.

The etching apparatus 30 comprises a first tank 32 and a second tank 34. Each tank 32 and 34 is preferably a tank formed of a non-corrosive material such as polyethylene or polypropylene. Each tank 32 and 34 has a chamber 36 and 38, respectively, which is defined by a base member and a sidewall member extending axially from the base member.

The etching apparatus 30 also includes a pumping device 42 for transferring fluid, and more particularly an etchant, between the chamber 36 and 38, and between each chamber 36, 38 and a reclamation device 43, as will be explained further below. The pumping device 42 is preferably a diaphragm pump, such as a Warren Rupp 1" Diaphragm Pump.

The etchant apparatus 30 also includes a first conduit 44 which extends between, and provides fluid communication between, the first tank 32 and a three-way junction 45 (FIG. 3). The first conduit 44 has a first end which extends through the base member of the first tank 32, and a second end which communicates with the three-way junction 45. The three-way junction 45 also communicates with a second conduit 46. The first conduit 44 and the three-way junction 45, thus, extend between, and provide fluid communication between, the first tank 32 and the second conduit 46. The first conduit 44 has a first valve device 48 disposed between the first tank 32 and the second conduit 46. The first valve device 48 has an open condition wherein fluid communication is established between the first tank 32 and the second conduit 46, and a closed condition wherein fluid communication is prevented between the first tank 32 and the second conduit 46. The second conduit 46 and the three-way junction 45 extend between, and provide fluid communication between, the first conduit 44 and the pumping device 42.

The etching apparatus 30 further includes a third conduit 50 which extends between, and provides fluid communication between, the second tank 34 and the three-way junction 45 (FIG. 3). The third conduit 50 has a first end which extends through the base member of the second tank 34, and a second end which communicates with the three-way junction 45. The third conduit 50 and the three-way junction 45, thus, extend between, and provide fluid communication between, the second tank 34 and the second conduit 46. The third conduit 50 has a second valve device 52 disposed between the second tank 34 and the second conduit 46. The second valve device 52 has an open condition wherein fluid communication is established between the second tank 34 and the second conduit 46, and a closed position, wherein fluid communication is prevented between the second tank 34 and the second conduit 46. The second conduit 46 and the three-way junction 45 extend between, and provide fluid communication between, the third conduit 50 and the pumping device 42.

The etching apparatus 30 further includes a fourth conduit 54 which extends between, and provides fluid communication between, the first tank 32 and a four-way junction 55 (FIG. 2). The fourth conduit 54 has a first end which extends through the sidewall member of the first tank 32, and a second end which communicates with the four-way junction 55. The four-way junction 55 also communicates with a fifth conduit 56. The fourth conduit 54 and the four-way junction 55, thus, extend between, and provide fluid communication between, the first tank 32 and the fifth conduit 56. The fourth conduit 54 has a third valve device 58 disposed between the first tank 32 and the fifth conduit 56. The third valve device 58 has an open condition wherein fluid communication is established between the first tank 32 and the fifth conduit 56, a closed condition wherein fluid communication is prevented between the first tank 32 and the fifth conduit 56. The fifth conduit 56 and the four-way junction 55 extend between, and provide fluid communication between, the fourth conduit 54 and the pumping device 42.

The etchant apparatus 30 further includes a sixth conduit 60 which extends between, and provides fluid communication between, the second tank 34 and the four-way junction 55. The sixth conduit 60 has a first end which extends through the sidewall member of the second tank 34, and a second end which communicates with the four-way junction 55. The sixth conduit 60 and the four-way junction 55, thus, extend between, and provide fluid communication between, the second tank 34 and the fifth conduit 56. The sixth conduit 60 has a fourth valve device 62 disposed between the second tank 34 and the fifth conduit 56. The fourth valve device 62 has an open condition wherein fluid communication is established between the second tank 34 and the fifth conduit 56, and a closed condition wherein fluid communication is prevented between the second tank 34 and the fifth conduit 56. The fifth conduit 56 and the four-way junction 55 extend between, and provide fluid communication between, the sixth conduit 60 and the pumping device 42.

The etchant apparatus 30 further includes a seventh conduit 66 which extends between, and provides fluid communication between, the reclamation device 43 and the four-way junction 55. The seventh conduit 66 has a first end which communicates with the reclamation device 43, and a second end which communicates with the four-way junction 55. The seventh conduit 66 and the four-way junction 55, thus, extend between, and provide fluid communication between, the reclamation device 43 and the fifth conduit 56. The seventh conduit 66 has a fifth valve device 68 disposed between the fifth conduit 56 and the reclamation device 43. The fifth valve device 68 has an open position wherein fluid communication is established between the fifth conduit 56 and the reclamation device 43, and a closed condition wherein fluid communication is prevented between the fifth conduit 56 and the reclamation device 43. The fifth conduit 56 and the four-way junction 55 extend between, and provide fluid communication between, the seventh conduit 66 and the pumping device 42.

Referring now to FIGS. 4–9, the method for removing at least a portion of a coating from at least one substrate having a coating selected from the group consisting of semiconductor coatings, metallic coatings, and mixtures thereof while keeping the substrate intact is disclosed. An advantage of the present invention is that the removal of coatings from a plurality of off-specification conductive material coated substrates can be accomplished in a relatively small footprint by the transfer of etchant from one tank to the other tank via the conduit and valve arrangements, as will be discussed below in more detail with reference to FIGS. 4–9.

Figure 4:
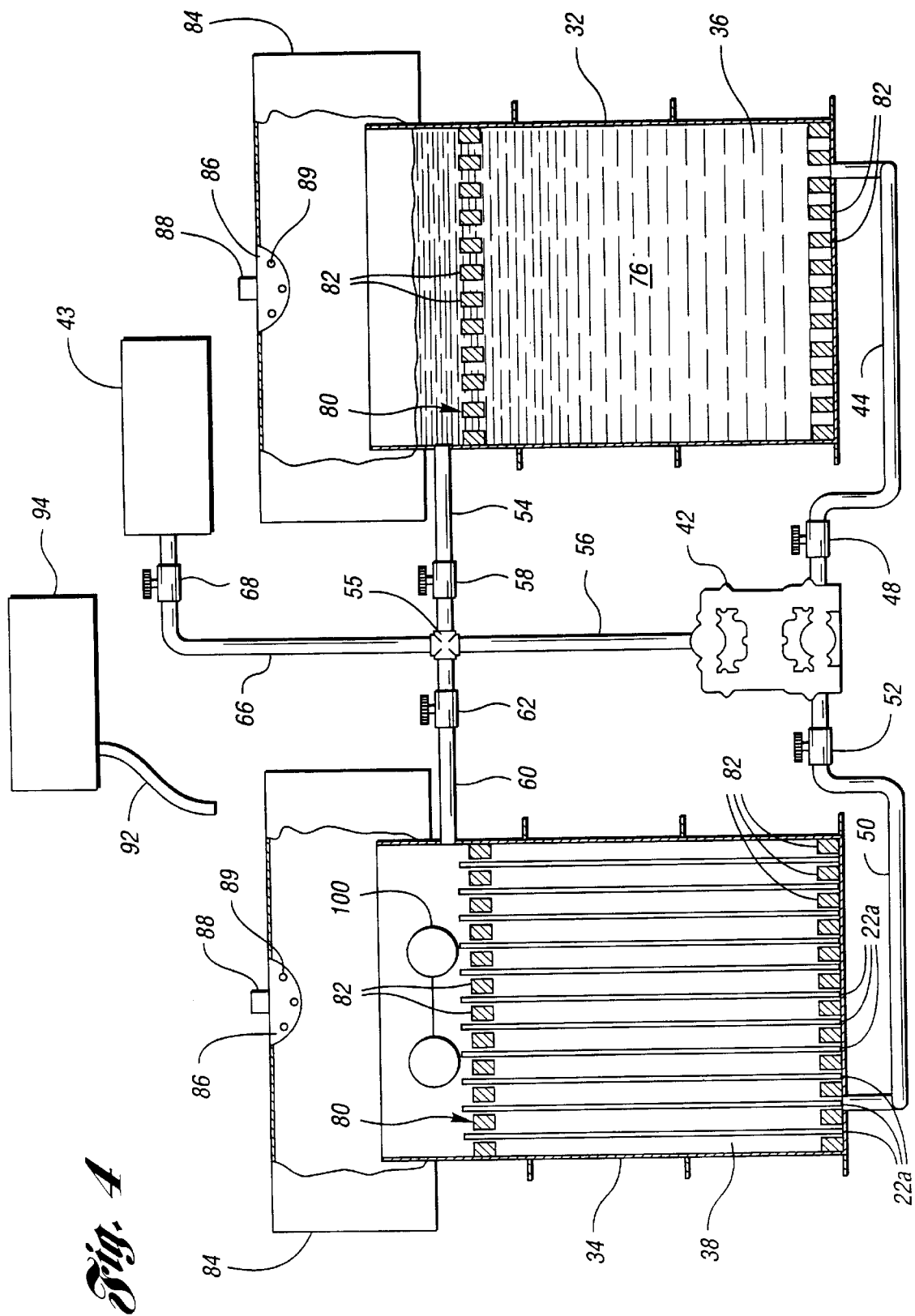
FIG. 4 is a view taken along line 4—4 of FIG. 3 and shown one stage of the method of the present invention.

Referring to FIG. 4, at the onset of the etching method, each valve device 48, 52, 58, 62 and 68 is in the closed condition and an etchant 76 capable of etching, i.e., dissolving, cadmium telluride and cadmium sulfide is contained in one of the tanks, and is preferably contained in the first tank 32, as shown in FIG. 4. The etchant 76 is preferably any suitable acidic solution, such as sulfuric acid, nitric acid, or ferric chloride in hydrochloric acid, or mixtures of acids. In a preferred embodiment, the etchant 76 comprises the following components detailed in Table I below.

TABLE I

| Material | Molar Concentration (Moles/liter) | Weight Percent |
| --- | --- | --- |
| Sulfuric Acid | 2.72 | 12.6 |
| Hydrogen Peroxide | 0.11 | 0.4 |
| Sodium 2-Ethyhexyl Sulfate* | 0.02 | 0.4 |
| De-ionized Water | Balance | 86.6 |

*Trade Name = Niaproff ® Anionic Surfactant 08, manufactured by Niacet Corporation of Niagara Falls, NY.

Preferably the first tank 32 contains about 400 liters of the etchant 76 described in Table I. It has been determined that 400 liters of etchant 76 can etch about 180–200 module subassemblies 22 before losing effectiveness and requiring a new batch of etchant 76. It is contemplated that the molar concentration of the sulfuric acid could range from about 1.2 to about 5.5 moles/liter. The etchant 76 may be made prior to introduction into the tank 32, or even more preferably, may be made within the tank 32.

A first plurality of module subassemblies 22a to be etched are loaded in the second tank 34, as shown in FIG. 4. As shown in FIG. 4, the second tank 34 initially does not contain any etchant 76. The subassemblies 22a may be loaded into the second tank 34 either before or after the etchant 76 is loaded into the first tank 32. The subassemblies 22a are oriented in the first tank 32 in a spaced apart, and parallel, arrangement with respect to each other. Each tank 32 and 34 contains a substrate holding device 80 for supporting subassemblies 22 in a spaced apart, and parallel, arrangement. The supporting devices 80 may be separate, and thus removable, from the tank 32 and 34, but are preferably integral with the tanks. Each supporting device 80 preferably comprises four rows of ridges 82 (of which, only two are shown) disposed on opposed interior sides of the sidewall members. The ridges 82 in each row are spaced apart to help define notches in which subassemblies 22 are received for supporting subassemblies 22 in a spaced apart and parallel arrangement.

Each tank 32 and 34 is covetable with a removable cover 84. Each cover 84 has a spray ball 86, which is preferably made of Teflon®, disposed on its underside. Each spray ball 86 has a plurality of apertures 89 for discharging water into the chambers 36 and 38. Each spray ball 86 has a water hose connection 88 for receiving a water supply hose 92. The water supply hose 92 is connected to a water supply 94. The water supply hose 92 is adaptable to be selectively connected to either water hose connection 88 on either cover 84.

After the subassemblies 22a have been loaded into the second tank 34, a pair of ultrasonic transducers 100 are supported on the upwardly facing ends of the subassemblies 22a, i.e., the ends of the subassemblies 22a that are facing the cover 84 on top of the first tank 32. The transducers 100, when activated, supply ultrasonic vibratory action to the tanks 32, 34, and thus to the contents of the tanks. The pair of transducers 100 are preferably push-pull ultrasonic transducers from Surftran-Martin Walter Ultrasonic Technology of Sterling Heights, Mich.

Figure 5:
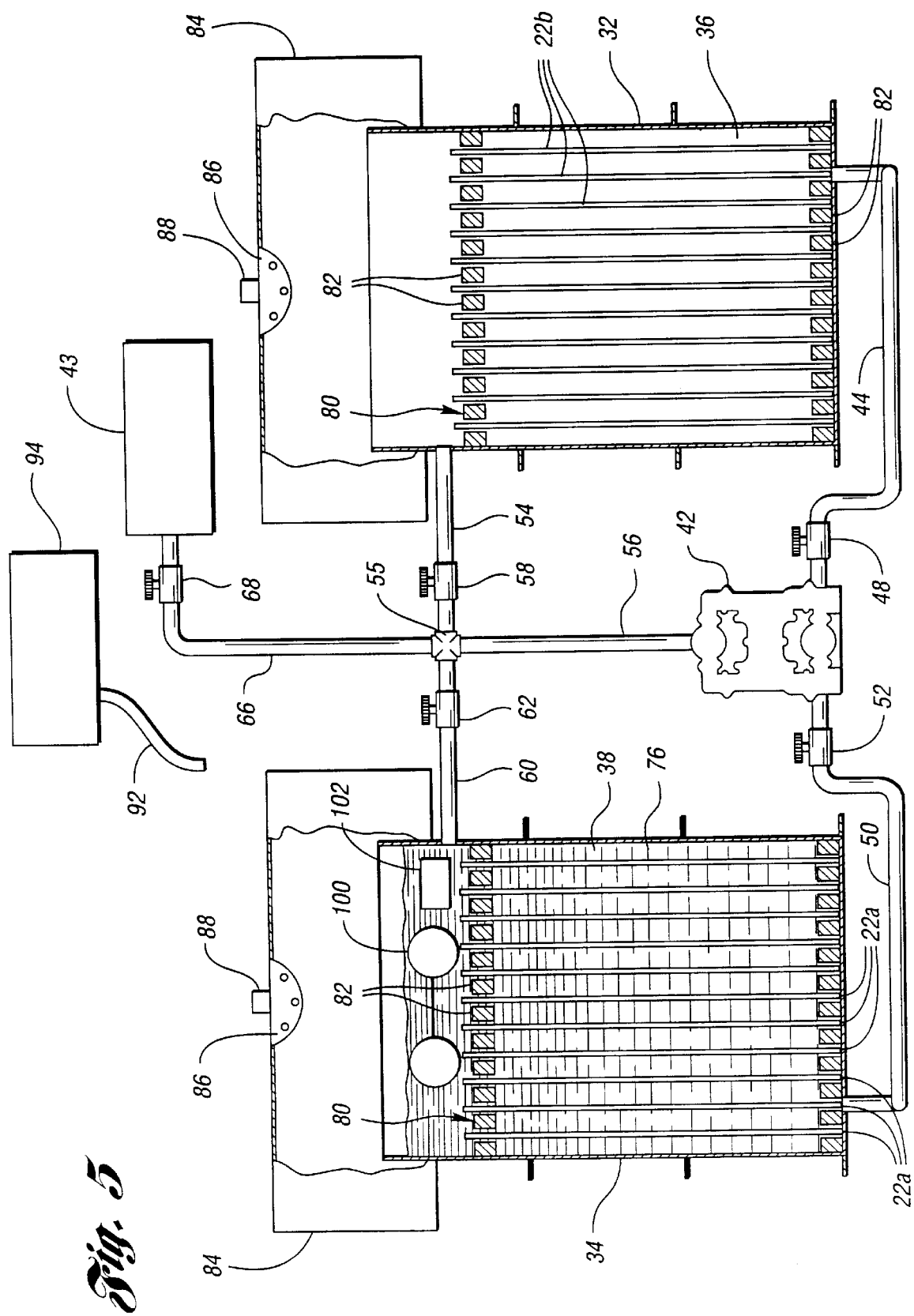
FIG. 5 is a view similar to FIG. 4 and shows a different stage of the method of the present invention.

Preferably, after the second tank 34 has been loaded with the subassemblies 22a, and even more preferably, after the ultrasonic transducers 100 have been supported on the subassemblies 22a, the etchant 76 from the first tank 32 is transferred to the second tank 34, as shown in FIG. 5. To transfer the etchant 76 from the first tank 32 to the second tank 34, the first valve device 48 and the fourth valve device 62 are activated to their open condition and the pumping device 42 is activated, while the second, third and fifth valves 52, 58 and 68, respectively, are retained in their closed condition. When in this arrangement, the pumping device 42 drains the etchant 76 from the first tank 32 into the first conduit 44, through the second conduit 46 into the pumping device 42, out through the fifth conduit 56, and through the sixth conduit 60 into the second tank 34. As shown in FIG. 3, the etchant apparatus 30 preferably includes a Programmable Logic Controller (PLC) 101 for selectively controlling the operation of the valve devices 48, 52, 58, 62 and 68 and the pumping device 42. It is important that the etchant 76 fully submerge the transducers 100 to help optimize the etching action on the subassemblies 22a.

After the etchant 76 has been transferred from the first tank 32 to the second tank 34, the first valve device 48 and the fourth valve device 62 are moved to their closed position to retain the etchant 76 in the second tank 34. The etchant 76, when in contact with the subassemblies 22a in the second tank 34, etches, i.e., dissolves, the cadmium sulfide coatings 18 and the cadmium telluride coatings 20 from the subassemblies 22a. The transducers 100 are activated to help facilitate the etching of the subassemblies 22a. Additionally, heat may be supplied to the etchant 76 via a heater 102 housed within each tank 32 and 34 to further facilitate the etching. It is desirable that the temperature of the etchant 76 be maintained at about 20–60° C., and more preferably, at about 40° C. The heaters 102 are preferably over the side quartz heaters from Serfilco, Ltd., of Northbrook, Ill. It should be noted that while it is preferred, as described above, to introduce the etchant 76 into the second tank 34 after the subassemblies 22a have been loaded therein, it is also contemplated that the subassemblies 22a and the transducers 100 may be loaded in the second tank 34 after the etchant has been introduced therein.

The etching of the subassemblies 22a continues in the second tank 34 for a period of time (i.e., the first etching cycle). Preferably, the first etching cycle for about 16 subassemblies 22a at about 20–60° C. is about 30–120 minutes, and more preferably about 60 minutes. As the first etching cycle is taking place in the second tank 34, a second plurality of subassemblies 22b are preferably loaded into the first tank 32, which is essentially free of etchant 76. It should be noted however that the second plurality of subassemblies 22b may be loaded in the first tank 32 when etchant 76 is contained therein.

After the first etching cycle in the second tank 34 is complete, the etchant 76 is transferred from the second tank 34 to the first tank 32 so that the second plurality of subassemblies 22b may be etched. The etchant 76 is transferred by activating the second valve device 52 and the third valve device 58 to their open condition, and activating the pumping device 42 while maintaining the first, fourth and fifth valve devices, 48, 62 and 68, respectively, in the closed condition. When in this arrangement, the pumping device 42 drains the etchant 76 from the second tank 34 into the third conduit 50, through the second conduit 46, into the pumping device 42, out through the fifth conduit 56, and through the fourth conduit 54 into the first tank 32. The second and third valve devices 52 and 58 are then closed to retain the etchant 76 in the first tank. The etchant 76, when in contact with the subassemblies 22b in the first tank 32, dissolves (etches) the cadmium sulfide coatings 18 and the cadmium telluride coatings 20 from the subassemblies 22b. The etching of the subassemblies 22b in the first tank 32 continues for about the same time (i.e., the second etching cycle), and under the same conditions, as the subassemblies 22a etched in the first etching cycle in the second tank 34.

Figure 6:
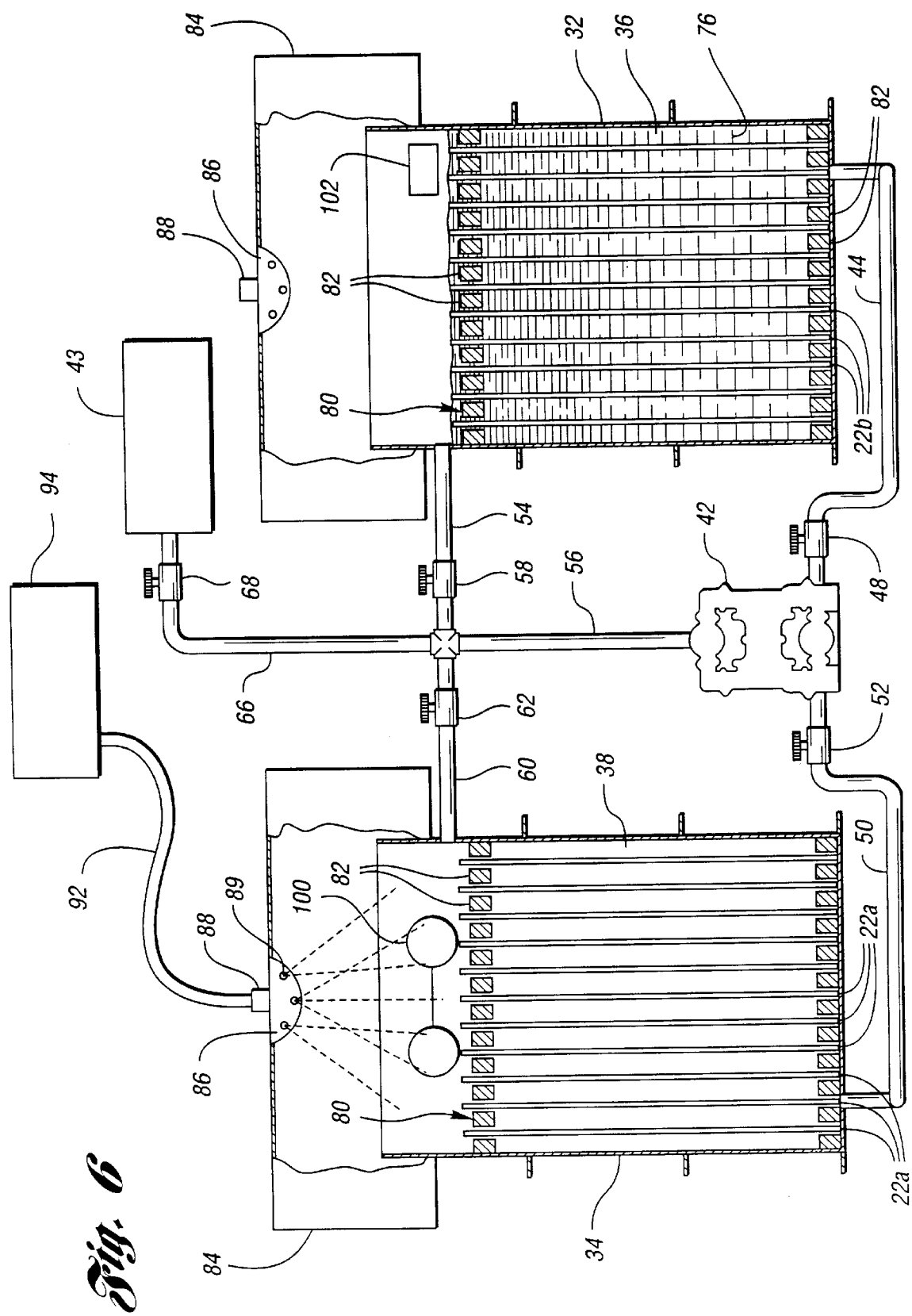
FIG. 6 is a view similar to FIG. 5 showing a different stage of the method of the present invention.
Figure 7:
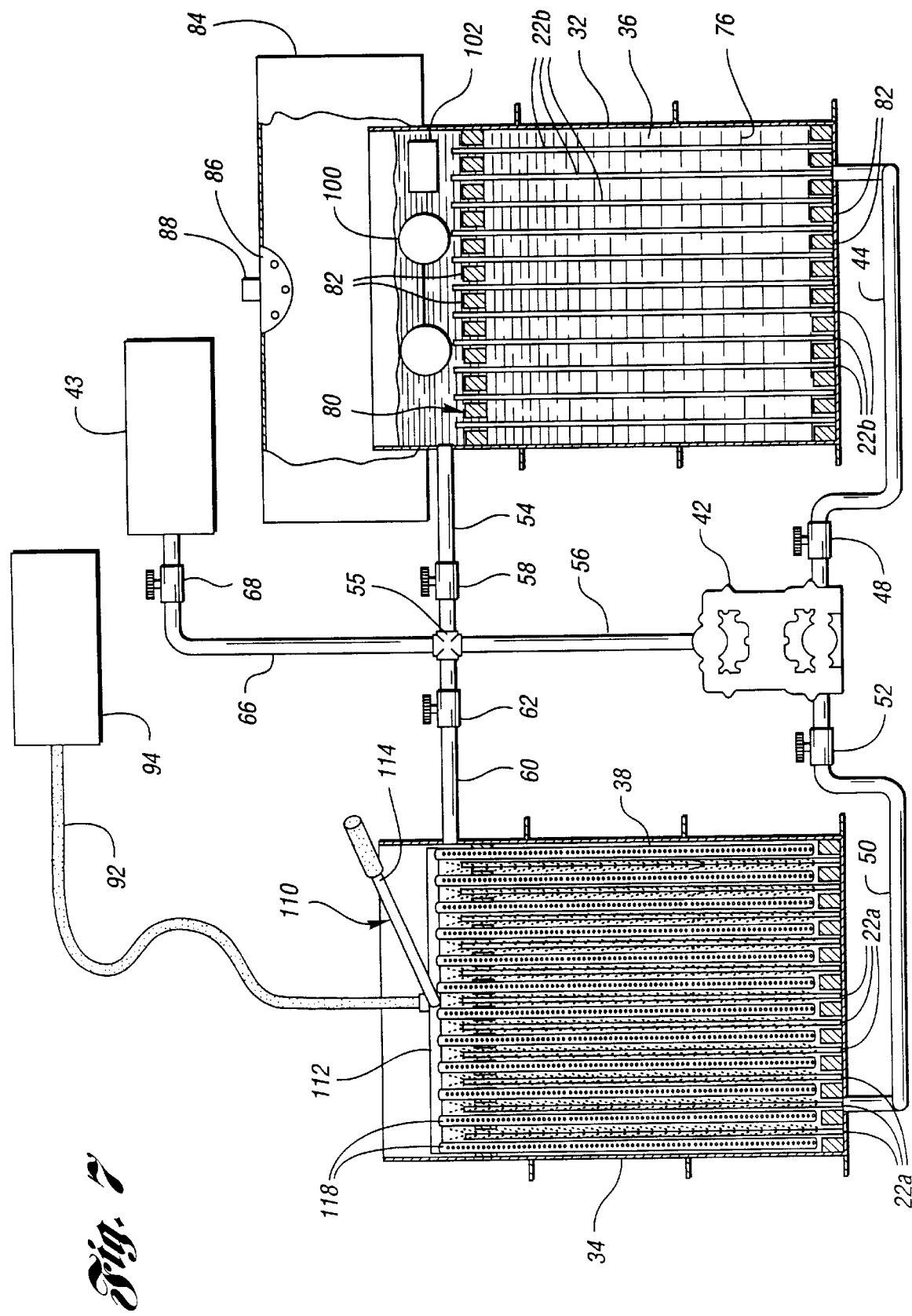
FIG. 7 is a view similar to FIG. 6 showing a differing stage of the method of the present invention.

Referring to FIG. 6, after the first etching cycle is complete and the etchant 76 has been transferred from the second tank 34 to the first tank 32, the water supply hose 92 is connected to the water hose connection 88 of the spray ball 86 on the cover 84 of the second tank 34. The water supply 94 is activated to deliver a rinsing fluid, preferably deionized water, through the spray ball 86 to provide a predetermined quantity of a water spray over the subassemblies 22a. The water spray acts as a "preliminary rinse" by knocking down and removing any residue and/or mist from the etchant 76 on the transducers 100 and the subassemblies 22a. After the preliminary rinse has been completed, the cover 84 can then be removed from the second tank 34 and the transducers 100 can be transferred from the second tank 34 and submerged within the etchant 76 in the first tank 32, as shown in FIG. 7. Ultrasonic vibratory action from the transducers 100 and/or heat from the heater 102 may be employed, as in the first etching cycle, to help facilitate the etching of the subassemblies 22b during the second etching cycle.

Figure 9:
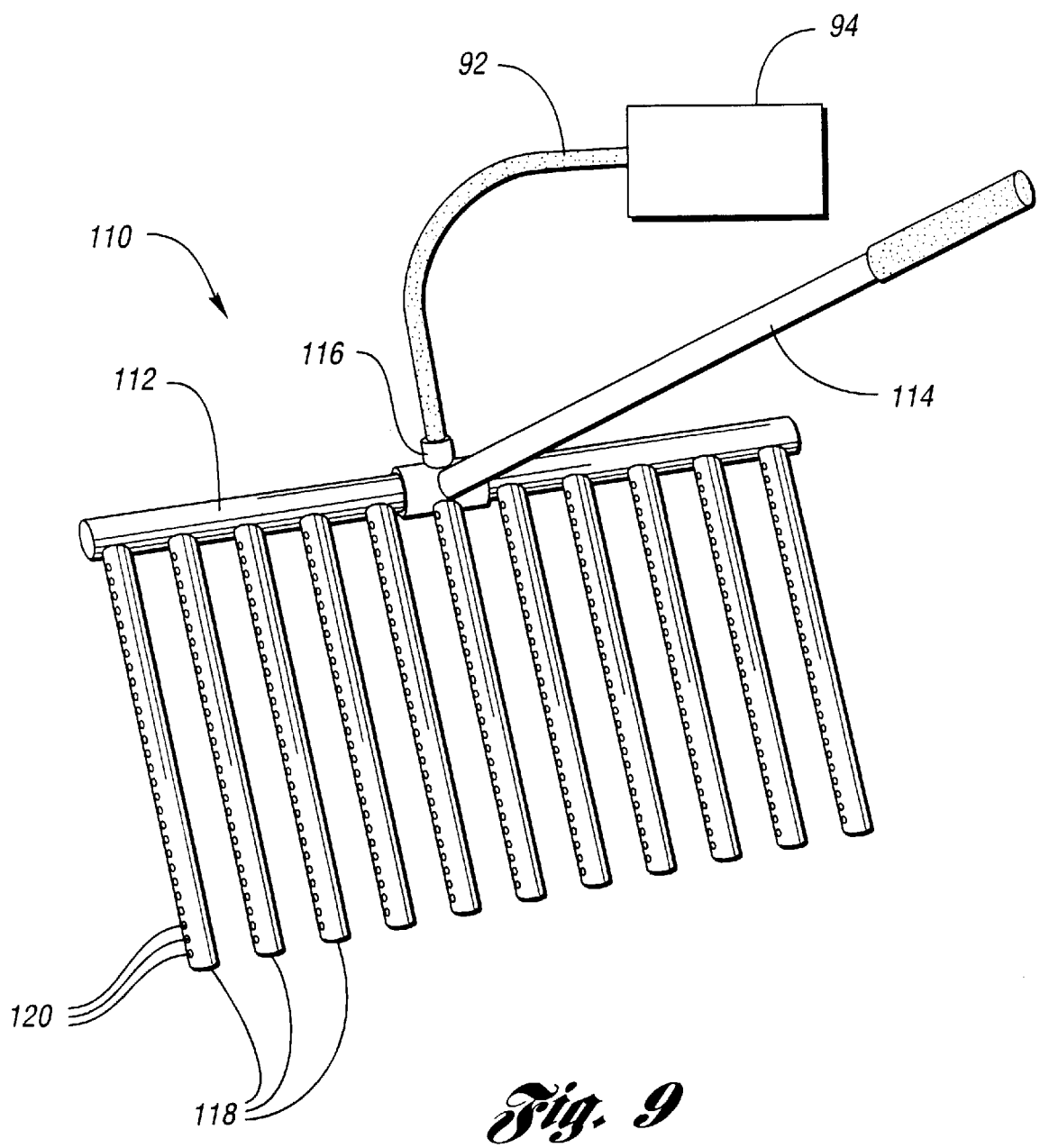
FIG. 9 is a perspective view of an apparatus for use with the present invention.

After the transducers 100 have been removed from the second tank 34, a final rinse of the subassemblies 22a may be accomplished via a rinse rake 110. Referring now to FIG. 9, the rake 110 includes a hollow base member 112 having an elongate handle 114 connected therewith. The base 112 has a nozzle connection 116 for connection with the hose 92 from the water supply 94. The base 112 has a plurality of depending tines 118, each of which has a plurality of apertures 120 for discharging water from the rake 110. After the cover 84 has been removed from the second tank 34, the tines 118 of the rake 110 are placed between adjacent subassemblies 22a and are moved back and forth across the substrates to deliver a final water rinse to the subassemblies 22a, as shown in FIG. 7.

After the final rinse has been completed, the cadmium telluride coatings 20 and the cadmium sulfide coatings 18 have been removed from the subassemblies 22a while leaving a first plurality of intact glass layers 12 with the tin oxide coating 14 thereon (i.e., preformed base substrate 16). The second tank 34 is then purged of the rinse water from the rinsing steps by conveying the rinse water from the second tank 34 to the reclamation device 43 wherein soluble metals and any insoluble material such as elemental sulfur from the coatings 18 and 20 can be separated from the deionized rinsed water, and further discarded or reused. To transfer the rinse water from the second tank 34 to the reclamation device 43, the second valve device 52 and the fifth valve device 68 are opened and the pumping device 42 is activated while the first, third and fourth valve devices, 48, 58 and 62 are kept closed. When in this arrangement, the pumping device 42 drains the etchant 76 from the second tank 34 into the third conduit 50, through the second conduit 46, into the pumping device 42, out through the fifth conduit 56, and through the seventh conduit 66 to the reclamation device 43. After the rinse water has been removed from the second tank 34, the second and fifth valve devices 52 and 68 are returned to their closed condition.

Figure 8:
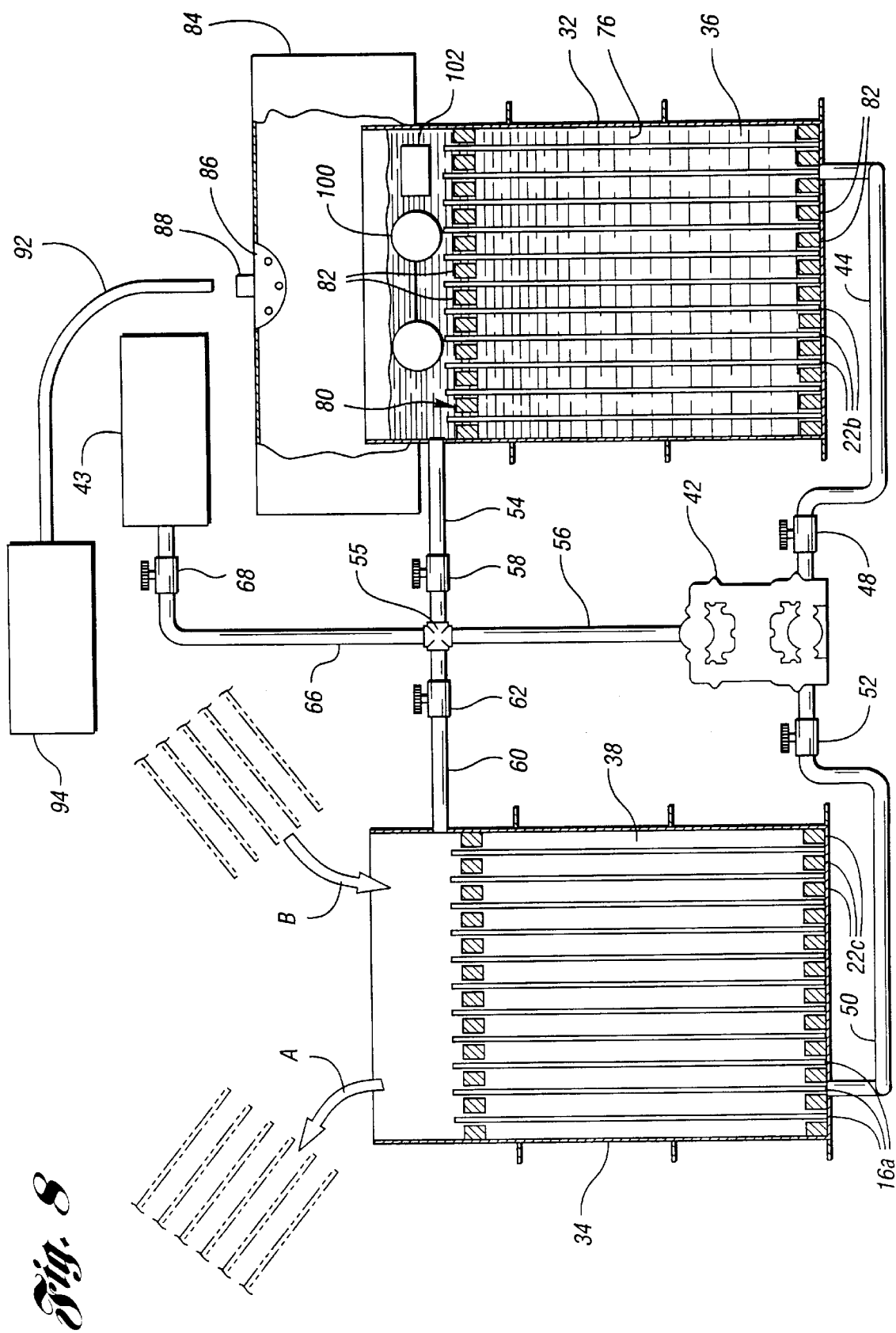
FIG. 8 is a view similar to FIG. 7 showing a different stage of the method of the present invention.

After the rinse water has been removed from the second tank 34, the base substrate 16 are then removed from the second tank 34 as shown by arrow A in FIG. 8 for reuse in preparing modules 10 in a subsequent deposition process. After the base substrates 16 have been removed from the second tank 34, a third plurality of subassemblies 22c, as shown by arrow B in FIG. 8, can then be loaded into the second tank 34 for etching and rinsing in the same manner as described above with respect to the first set of subassemblies 22a to yield a third plurality of base substrates 16.

After the second etching cycle is completed in the first tank 32, the etchant 76 is transferred to the second tank 34 in the same manner as described above, to etch the third set of subassemblies 22c. After the etchant 76 has been transferred from the first tank 32 to the second tank 34, the second plurality of subassemblies 22b in the first tank 32 are then rinsed in the same manner as described above in connection with the first plurality of subassemblies 22a in the second tank 34 to yield a second plurality of preformed base substrates 16. The second plurality of preformed base substrates 16 may then be removed from the first tank 32 and a new set of subassemblies 22 may thereafter be introduced into the first tank for etching and rinsing.

These etching cycles can be repeated as many times as the etchant 76 is able to be effective in etching the cadmium coatings 18 and 22 from subassemblies 22. If each plurality of subassemblies 22 comprises about 16 subassemblies, the etchant 76 described in Table I is typically effectively for about 40 etching cycles. After the etchant 76 is no longer able to effectively etch the subassemblies 22, the etchant 76 is transferred from either tank 32 and 34 to the reclamation device 43 so that the soluble metals and any insoluble particles such as elemental sulfur from the semiconductor coatings 18 and 20 in the etchant can be separated from the etchant and further discarded or reused.

The present invention provides for an inexpensive and high throughput etching of off-specification coated substrates in a compact footprint by having the etching and the rinsing of a set of substrates take place in the same tank, with only one loading and one unloading of the set of substrates. By transferring the etchant between the tanks, while subassemblies/base substrates are being loaded or unloaded in one tank, an etching cycle can be taking place in the other tank where the etchant is contained.

While embodiments of the invention have been illustrated and described, it is not intended that these embodiments illustrate and describe all possible forms of the invention. Rather, the words used in the specification are words of description rather than limitation, and that various changes may be made without departing from the spirit and scope of the invention.

The term "cadmium" as used above and in the claims, can mean elemental cadmium as well as cadmium compounds. The term "tellurium", as used above and in the claims, can mean elemental tellurium as well as tellurium compounds.

What is claimed is:

1. A method for etching substrates, the method comprising:
   providing at least a first and a second substrate having a coating selected from the group consisting of semiconductor coatings, metallic coatings, and mixtures thereof,
   introducing at least the first substrate and an etchant into a first tank to etch at least a portion of the coating from the first substrate;
   introducing at least the second substrate into a second tank;
   transferring the etchant from the first tank to the second tank to etch at least a portion of the coating from the second substrate; and
   removing the etched first substrate from the first tank, wherein the first substrate is rinsed with a rinsing fluid before being removed from the first tank.

2. A method for etching substrates as in claim 1 wherein the first substrate is introduced into the first tank before the introduction of the etchant into the first tank.

3. A method for etching substrates as in claim 1 wherein the second substrate is introduced into the second tank before the etchant is transferred from the first tank to the second tank.

4. A method for etching substrates as in claim 1 wherein the etchant is transferred from the first tank to the second tank before removing the first substrate from the first tank.

5. A method for etching substrates as in claim 1 wherein the coating comprises cadmium.

6. A method for etching substrates as in claim 5 wherein the coating comprises a semiconductor coating.

7. A method for etching substrates as in claim 6 wherein the substrate comprises a cadmium telluride photovoltaic solar cell module subassembly comprising a glass layer, a tin oxide coating and at least one semiconductor cadmium coating.

8. A method for etching substrates as in claim 7 wherein each of the substrates, after being etched, comprises the glass layer and the tin oxide coating, with the cadmium coating being dissolved in the etchant.

9. A method for etching substrates as in claim 1 wherein the etchant comprises an acidic solution.

10. The method of claim 9 wherein the acidic solution comprises at least sulfuric acid.

11. A method for etching substrates as in claim 1 wherein an ultrasonic vibration device is provided for aiding the etching of the coating, the ultrasonic vibration device being selectively submergible in the etchant during the etching.

12. A method for etching substrates as in claim 1 wherein water is provided for rinsing the substrates after the substrates have been etched.

13. A method for etching substrates as in claim 12 wherein each tank is provided with a cover having a water spraying device for spraying water over the substrates.

14. A method for etching substrates as in claim 13 wherein a first plurality of substrates are provided, the first plurality of substrates include the first substrate, each of the first plurality of substrates have a coating selected from the group consisting of semiconductor coatings, metallic coatings, and mixtures thereof, a holding device being provided within the first tank for supporting each of the first plurality of substrates in a spaced apart arrangement.

15. A method for etching substrates as in claim 14 wherein a rinsing device is provided which has a plurality of tines for delivering water to the first plurality of substrates, each tine having at least one aperture for discharging water, the tines being slidably movable across the first plurality of substrates.

16. A method for etching substrates as in claim 1 wherein a pump is provided for transferring the etchant from the first tank to the second tank.

17. A method for etching substrates as in claim 1 wherein the temperature of the etchant is maintained between about 20–60° C. during etching.

18. The method of claim 1 wherein the etchant is transferred to the second tank before the etchant reaches saturation.

19. The method of claim 1 further comprising rinsing the first substrate in the first tank with water before removing the first substrate from the first tank, the water forming a solution comprising water and etched materials, and transferring the solution to a third tank and separating the etched materials from the water in the third tank.

20. The method of claim 19 further comprising etching additional substrates, different from the first and second substrates, in the first and second tanks with the etchant until the etchant reaches saturation, wherein the etching is taking place in one of the tanks at a time.

21. The method of claim 20 further comprising transferring the etchant to the third tank after the etchant reaches saturation, the saturated etchant comprising etchant and etched materials, and separating the etched materials from the etchant in the third tank.

22. A method for etching a substrate, the method comprising:

provided a substrate having a coating selected from the group consisting of semiconductor coatings, metallic coatings, and mixtures thereof;

introducing the substrate into a first tank;

introducing an etchant capable of etching the coating from the substrate into a second tank;

transferring the etchant from the second tank to the first tank to etch at least a portion of the coating from the substrate within the first tank;

transferring the etchant from the first tank back to the second tank; and removing the etched substrate from the first tank, wherein the substrate is rinsed with a rinsing fluid before being removed from the first tank.

23. A method for etching a substrate as in claim 22 wherein the substrate is introduced into the first tank before transferring the etchant from the second tank to the first tank.

24. A method for etching a substrate as in claim 22 wherein the etchant is transferred from the first tank back to the second tank before the substrate is removed from the first tank.

25. A method for etching a substrate of claim 22 wherein the substrate is rinsed with water after the etchant is transferred from the first tank.

26. A method for etching a substrate of claim 22 wherein the substrate comprises a cadmium telluride photovoltaic solar cell module subassembly comprising a glass layer, a tin oxide coating and at least one semiconductor cadmium coating.

27. A method for etching a substrate of claim 22 wherein the etchant comprises an acidic solution.

28. A method for etching a substrate of claim 22 wherein a second substrate having a coating selected from the group consisting of semiconductor coatings, metallic coatings, and mixtures thereof is introduced within the second tank, the second substrate being etched when the etchant is in the second tank.

29. The method of claim 22 wherein the etchant is transferred to the second tank before the etchant reaches saturation.

30. A method for etching cadmium telluride photovoltaic solar cell module subassemblies comprising a glass layer, a tin oxide coating and at least one semiconductor cadmium coating, the method comprising:

providing at least a first and a second cadmium telluride photovoltaic solar cell module subassembly;

introducing at least the first subassembly and an etchant into a first tank to etch at least a portion of the coatings from the first substrate;

introducing at least the second subassembly into a second tank;

before the etchant in the first tank becomes saturated, transferring the etchant from the first tank to the second tank to etch at least a portion of the coatings from the second subassembly; and removing the etched first subassembly from the first tank, wherein the first subassembly is rinsed with a rinsing fluid before being removed from the first tank.

* * * * *